(12) United States Patent
Anderson et al.

(10) Patent No.: US 6,291,878 B1
(45) Date of Patent: Sep. 18, 2001

(54) PACKAGE FOR MULTIPLE HIGH POWER ELECTRICAL COMPONENTS

(75) Inventors: W. Kyle Anderson; Arthur A. Pershall; Stephen E. Jackson, all of Rockford, IL (US)

(73) Assignee: Sundstrand Corporation, Rockford, IL (US)

( * ) Notice: Subject to any disclaimer, the term of this patent is extended or adjusted under 35 U.S.C. 154(b) by 0 days.

(21) Appl. No.: 08/052,015

(22) Filed: Apr. 22, 1993

(51) Int. Cl.[7] ................................................. H01L 23/48
(52) U.S. Cl. .......................... 257/691; 257/723; 257/725
(58) Field of Search .................................... 257/674, 691, 257/723, 725, 728, 724, 909, 925; 174/15.1, 99 R, 69, 701, 707, 15.199 R; 361/64, 701, 707

(56) References Cited

U.S. PATENT DOCUMENTS

| | | | |
|---|---|---|---|
| 3,400,311 | * 9/1968 | Dahlberg et al. | 257/724 |
| 4,574,299 | 3/1986 | Glascock, II et al. | 257/746 |
| 4,614,964 | * 9/1986 | Sutrina | 257/691 |
| 4,639,760 | 1/1987 | Granberg et al. | 257/705 |
| 4,649,416 | 3/1987 | Borkowski et al. | 257/728 |
| 4,675,785 | * 6/1987 | Young | 257/721 |
| 4,766,481 | 8/1988 | Gobrecht et al. | 257/664 |
| 4,878,106 | 10/1989 | Sachs | 257/796 |

* cited by examiner

Primary Examiner—Roy Potter
(74) Attorney, Agent, or Firm—Marshall, O'Toole, Gerstein, Murray & Borun

(57) ABSTRACT

A semiconductor package includes a plurality of semiconductor devices disposed in an array surrounding a central electrode structure carried by a package support member. The package is capable of withstanding high voltages and currents and includes a heat exchanger integral therewith.

3 Claims, 5 Drawing Sheets

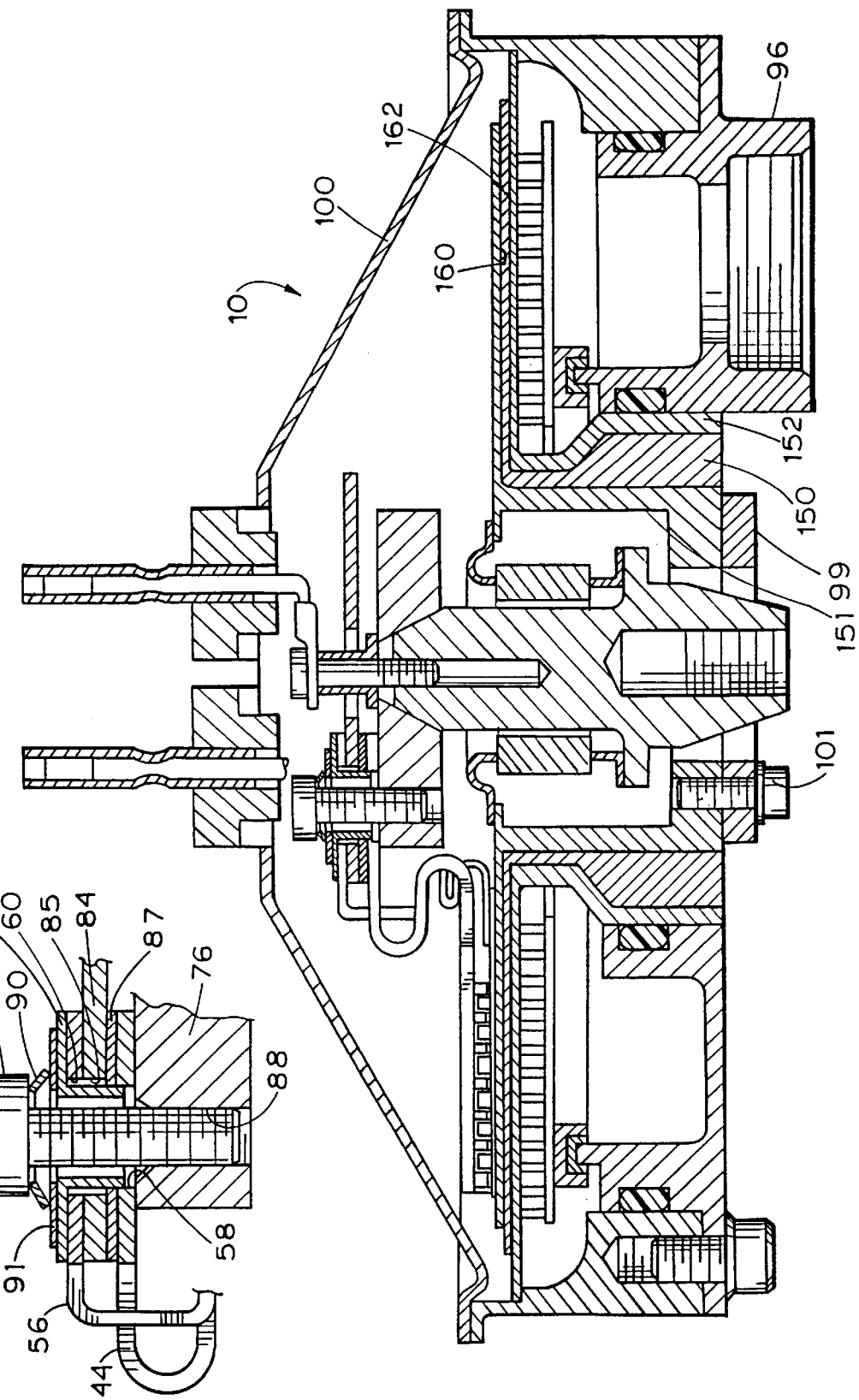

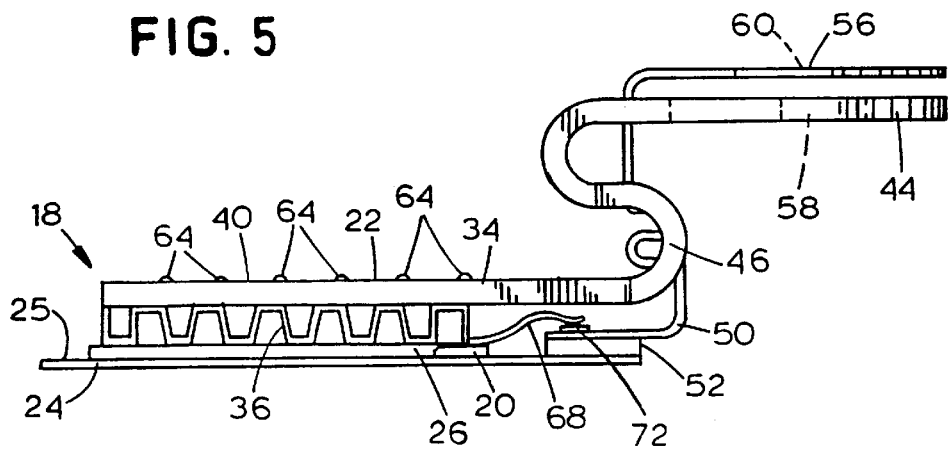
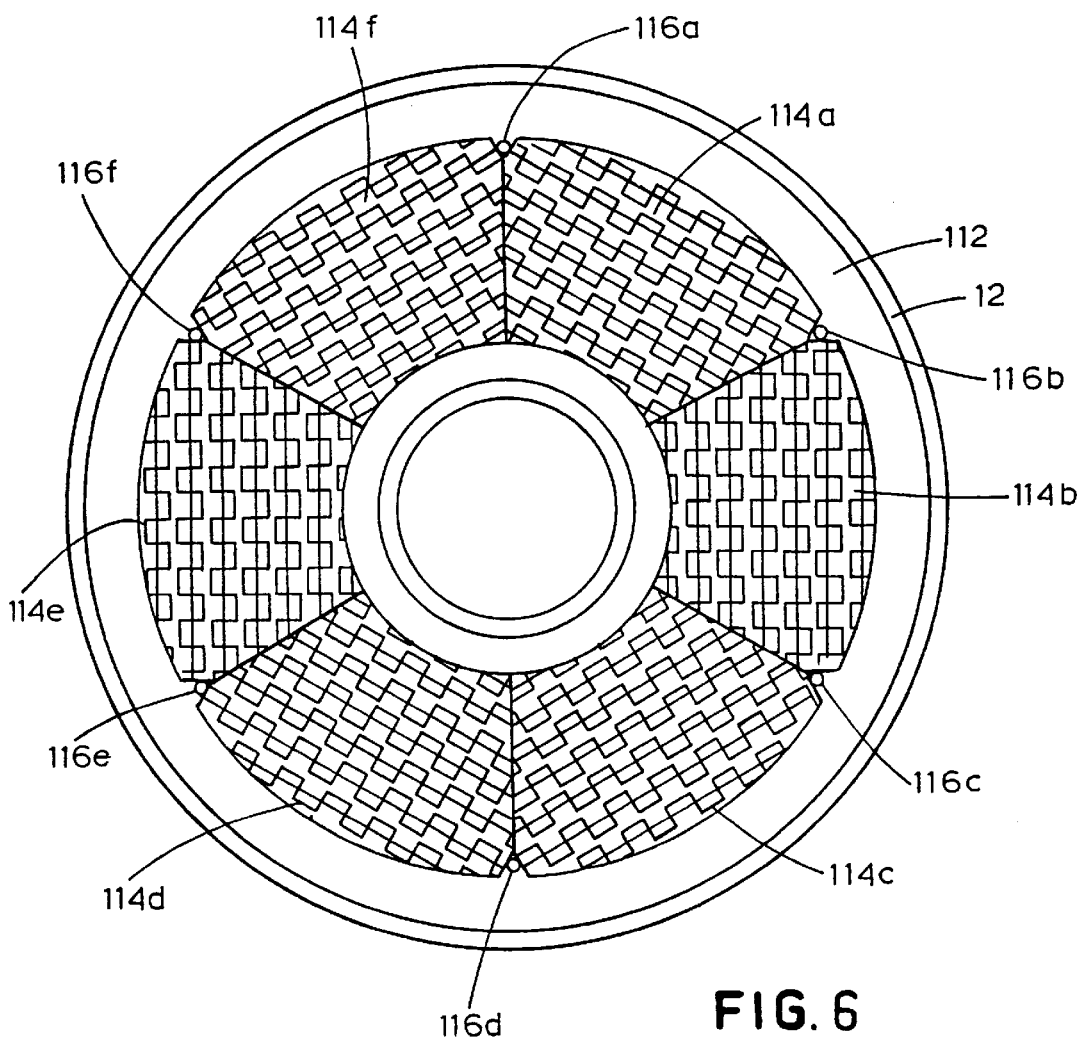

PACKAGE FOR MULTIPLE HIGH POWER ELECTRICAL COMPONENTS

TECHNICAL FIELD

The present invention relates generally to electrical component packages, and more particularly to a package for housing multiple high power electrical components.

BACKGROUND ART

There is a need, particularly in aircraft and aerospace installations, for compact and light weight power systems. Such power systems typically include a power converter that utilizes multiple high power switches having very high voltage and current ratings. Such power switches handle substantial amounts of power and thus dissipate heat which can adversely affect the performance of the switches and other electrical components in the vicinity thereof. The need to reduce system size and weight, however, greatly complicates the removal of such heat.

In addition, there is often a need to connect devices in parallel to obtain the required current handling capability. In order to maintain proper load sharing between parallel connected devices, lead lengths must be accurately controlled and kept as short as possible.

The foregoing considerations militate in favor of the incorporation of multiple high power components within a single package. In this way, compact assemblies that can withstand the high voltage and current levels required for proper operation can be fabricated in a small volume.

Typically, the package cannot be tested for operability until it is fully assembled. This fact creates a substantial probability that a faulty package will be produced since the incorporation of only one faulty switch into a package will render the entire package defective. This is undesirable, particularly in light of the fact that it may prove uneconomical to replace a faulty switch after it has been assembled in a package, thereby resulting in waste of operable components.

SUMMARY OF THE INVENTION

A semiconductor package according to one aspect of the present invention includes a plurality of semiconductors which are arranged in the package in an advantageous manner.

More particularly, in accordance with one aspect of the present invention, a semiconductor package includes an electrically conductive package support member having a central aperture therethrough, a central electrode structure extending through the central aperture of the package support member and electrically isolated therefrom and a plurality of semiconductor devices disposed on the package support member in an array surrounding the central electrode structure. Each semiconductor device includes first and second electrodes wherein the first electrodes of the semiconductor devices are electrically interconnected by the package support member. A first terminal is electrically connected to the package support member. The central electrode structure includes a bus for electrically interconnecting the second electrodes of the semiconductor devices and a second terminal is coupled to the bus.

Preferably, each semiconductor device is disposed on an associated device support structure having a base plate electrically interconnecting the first electrode to the package support member. Means are provided for electrically coupling the second electrode of the semiconductor device to the bus of the central electrode structure. Also in accordance with the preferred embodiment, the coupling means comprises a strip of conductive material disposed on corrugated fin stock.

Still further in accordance with the preferred embodiment, a heat exchanger is disposed in thermal contact with the semiconductor devices wherein the heat exchanger includes a base housing joined to the package support member and defines an enclosure and means disposed in the enclosure in contact with the package support member for conducting cooling fluid.

In accordance with a highly preferred form of the invention, each semiconductor comprises a power transistor and the first and second electrodes comprise main current path electrodes of the transistors. Currents flow through the package support member into the first electrodes and flow out of the second electrodes, the bus and the second terminal.

Also in accordance with this form of the present invention, each semiconductor includes a control electrode and the package further includes an additional bus for interconnecting the control electrodes.

In accordance with another aspect of the present invention, a method of fabricating a semiconductor package includes the steps of assembling each of a plurality of semiconductor devices on an associated device support structure wherein each semiconductor device has a first electrode electrically connected to an electrically conductive base plate of the device support structure and a second electrode and testing the semiconductor devices after such devices have been assembled on the associated support structures to determine which are operable. The method further includes the step of providing a package support member having an electrically conductive support surface and a central aperture therethrough. The base plates of those device support structures carrying the semiconductor devices determined to be operable are electrically and mechanically coupled to the support surface so that the first electrodes of the devices are interconnected by the support surface and so that the semiconductor devices form an array surrounding the central aperture. A first terminal is connected to the support surface and a central electrode structure is provided having a bus and a second terminal electrically connected to the bus. The central electrode structure is mechanically secured to the package support member such that the former extends through the central aperture and is electrically isolated from the package support member. Further, the second electrodes of the semiconductors are electrically connected to the bus of the central electrode structure.

Each semiconductor device preferably further includes a third electrode and the central electrode structure further includes an additional bus and a third terminal electrically connected to the additional bus wherein the third electrodes of the semiconductors are electrically connected to the additional bus.

The method of this aspect of the present invention may include the further step of securing a heat exchanger to the package support member so that the heat exchanger is in thermal contact with the semiconductor devices. The step of securing preferably includes the step of attaching fin stock segments to a lower surface of the package support member opposite the support surface. The fin stock segments are preferably enclosed and cooling fluid is provided to the enclosed fin stock segments.

A semiconductor package constructed in accordance with the present invention does not encounter the disadvantages of the prior art since the subassemblies mounted within the package may be separately tested before incorporation therein. Thus, waste is held to a minimum. Also, the semiconductor devices are cooled in an efficient fashion and occupy only a small amount of volume, thus rendering the package particularly suitable for aircraft and aerospace installations.

BRIEF DESCRIPTION OF THE DRAWINGS

FIG. 2A comprises an enlarged fragmentary view of a portion of the switch package shown in FIG. 2;

FIG. 5 comprises a side elevational view of the subassembly of FIGS. 3 and 4 with the semiconductor device shown in fragmentary elevation;

FIG. 6 comprises an elevational view of the bottom of the switch package of FIG. 1 with a bottom cover removed illustrating the orientation of the fin stock segments disposed on a bottom surface of the package support member;

FIG. 9 comprises a sectional view similar to FIG. 2 illustrating an alternative embodiment of the present invention.

DESCRIPTION OF THE PREFERRED EMBODIMENTS

Figure 1:
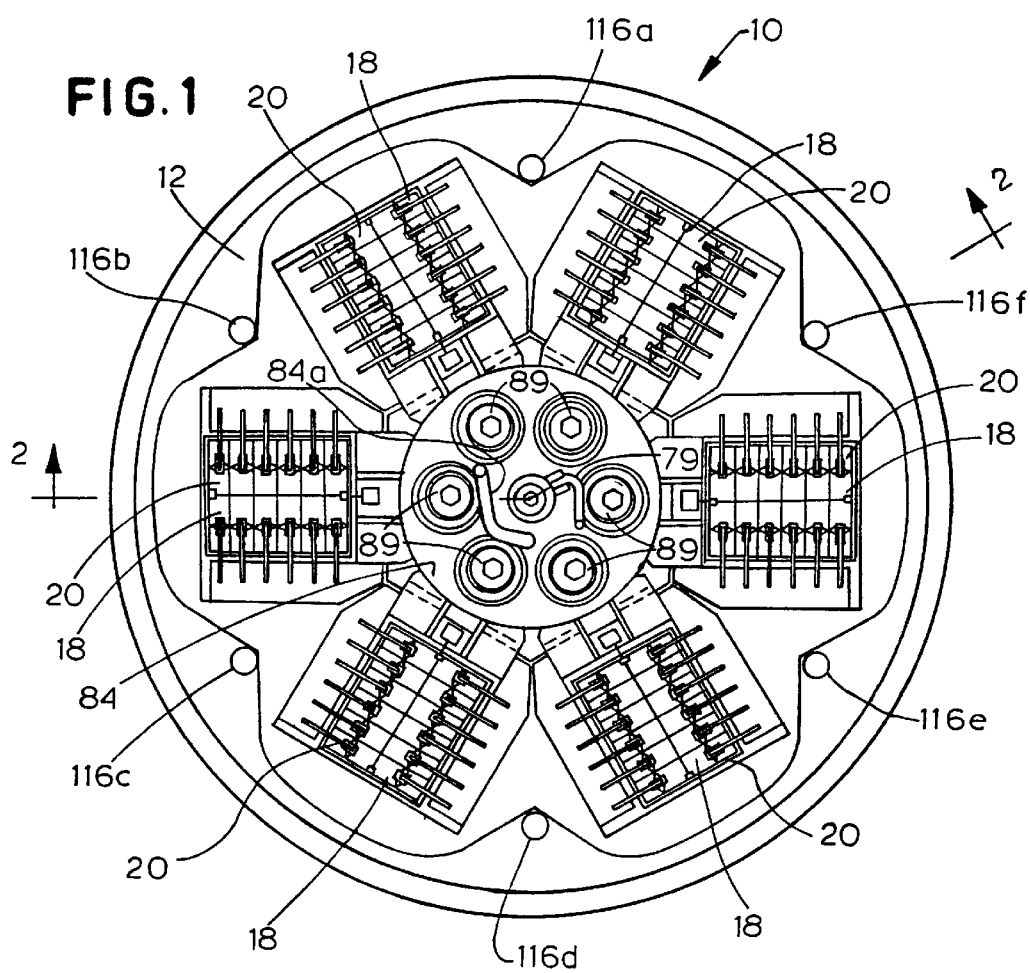
FIG. 1 comprises a plan view of the switch package of the present invention with a top cover removed.
Figure 2:
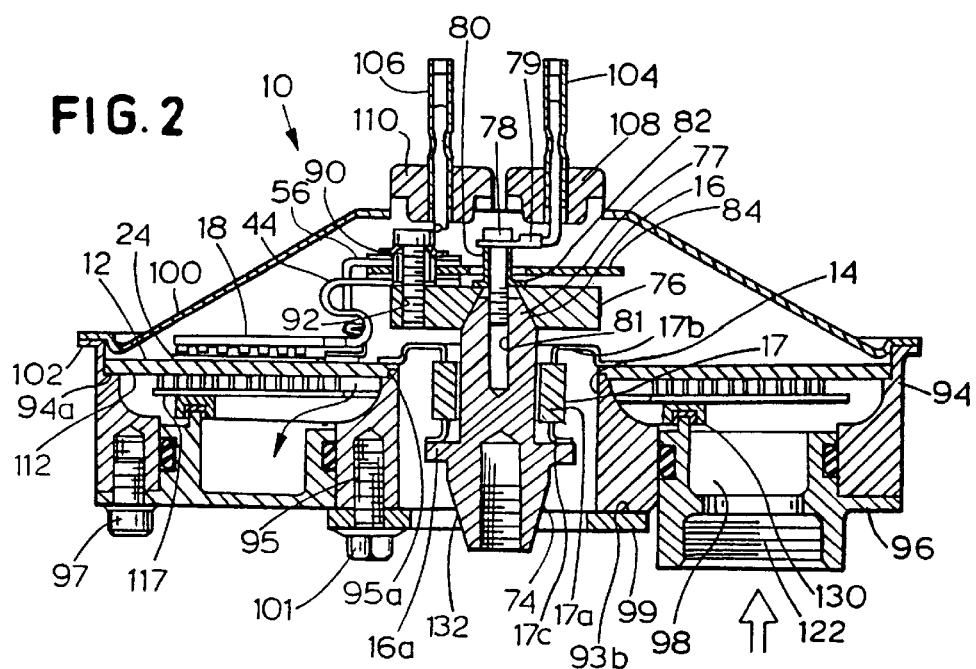
FIG. 2 comprises a sectional view taken generally ally along the lines 2—2 of FIG. 1.

Referring now to FIGS. 1 and 2, a switch or semiconductor package 10 according to the present invention includes an electrically conductive package support member 12 having a central aperture 14 therethrough. A central electrode structure 16 extends through the central aperture 14 of the package support member 12 and is mechanically secured thereto by means of a metalized ceramic insulator 17 having an annular ceramic main body 17a and stamped copper end rings 17b and 17c soldered, brazed or otherwise secured thereto. The end ring 17b is cold welded to the package support member 12 while the end ring 17c is soldered, brazed or otherwise secured to a flange 16a of the central electrode structure 16. The central electrode structure 16 is electrically isolated from the package support member 12 by the ceramic main body 17a. A plurality of subassemblies 18 each including a semiconductor device 20 are disposed on the package support member 12 in an array surrounding the central electrode structure 16. In the preferred embodiment, there are six subassemblies 18, each including an insulated gate bipolar transistor (IGBT) 20, although a different number of subassemblies each containing a different type of semiconductor device may alternatively be disposed on the member 12. As noted in greater detail hereinafter, each semiconductor device 20 includes at least first and second electrodes wherein the first electrodes of the devices 20 are electrically interconnected by the package support member 12 and the second electrodes are electrically interconnected by fastening to the central electrode structure 16.

Figure 3:
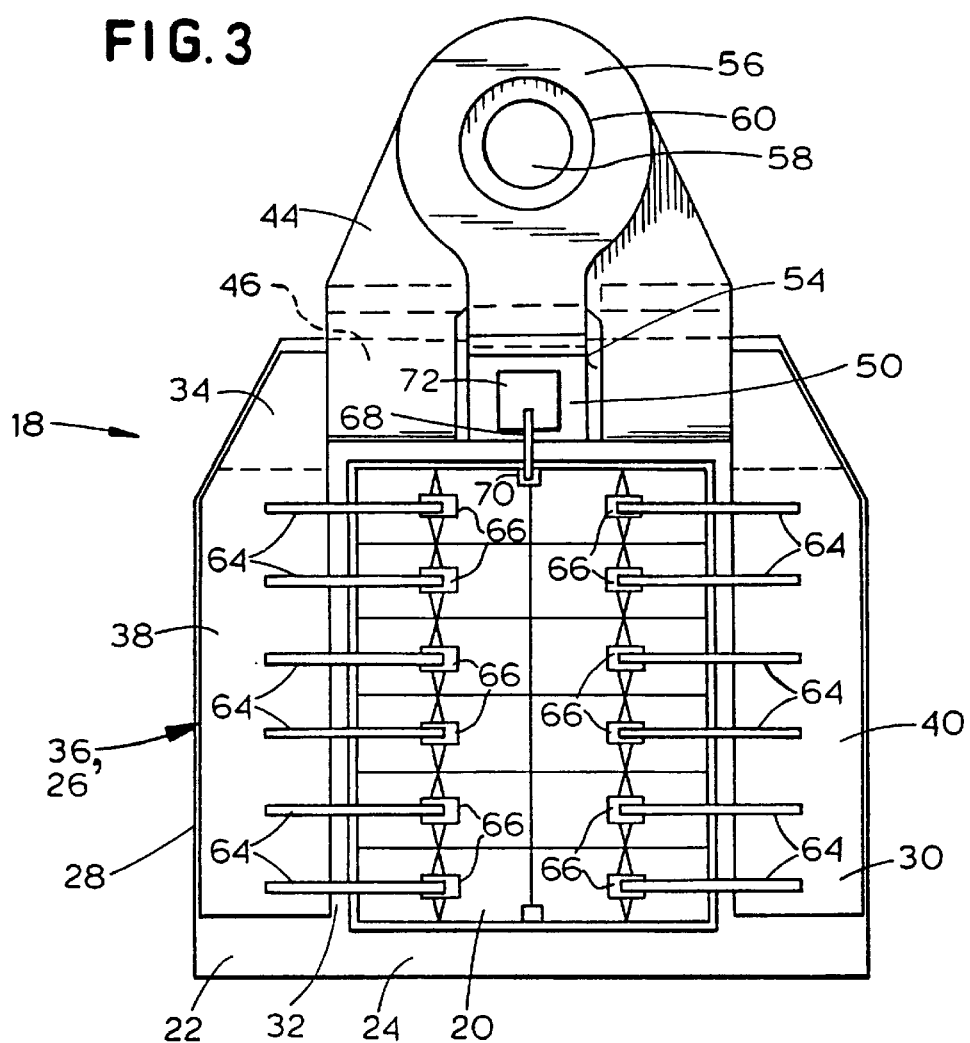
FIG. 3 comprises a plan view of one of the semiconductor subassemblies of FIG. 1.
Figure 4:
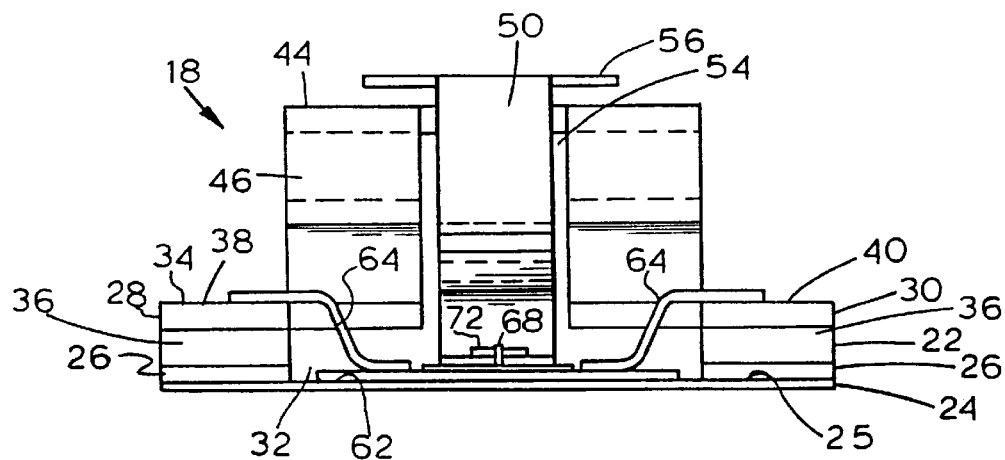
FIG. 4 comprises an end elevational view of the semiconductor subassembly of FIG. 3.

Referring now to FIGS. 3–5, the subassemblies 18 are identical, and hence only one of which will be described in detail. Each subassembly 18 includes a device support structure 22 including an electrically conductive base plate 24 having a low coefficient of thermal expansion (CTE). In the preferred embodiment, the base plate 24 is made of molybdenum plated or clad with nickel or copper on at least an upper face 25 thereof, although different materials might alternatively be used. Strips of alumina 26 or another electrically insulative and thermally conductive material are disposed atop the base plate 24 adjacent to the first and second sides 28, 30 of the subassembly 18 so that a gap 32 is disposed between the strips 26. Disposed atop the strips of alumina 26 is a U-shaped strip 34 fabricated of copper or another electrically conductive material and a thermal stress relieving member in the form of a section of corrugated copper fin stock 36. More specifically, as seen in FIG. 3, the U-shaped strip of copper 34 includes first and second legs 38, 40 disposed on either side of the gap 32. The sections of fin stock 36 are disposed beneath the legs 38, 40 atop the strips of alumina 26. A connection tab 44 is interconnected to the legs 39, 40 by an S-shaped base portion 46. As noted in greater detail hereinafter, electrical connection to the second electrode or emitter of the semiconductor device 20 may be effected by way of the connection tab 44, the S-shaped portion 46 and the legs 38, 40 of the strip of copper 34.

A further strip of copper 50 or another electrically conductive material is disposed atop an alumina block 52 or another body of thermally conductive, electrically insulative material. The strip 50 includes bends therein to allow for thermal expansion and contraction and extends upwardly through an aperture or space 54 provided in the connection tab 44 of the strip 34. The copper strip 50 includes a connection tab 56 which is disposed above the connection tab 44 of the copper strip 34. The connection tabs 44, 56 have aligned apertures 58, 60, respectively.

With specific reference to FIGS. 3 and 4, the IGBT 20 includes a collector electrode disposed on a face 62 thereof which is soldered or otherwise electrically and mechanically connected directly to the upper face 25 of the base plate 24. A series of wire bonds 64 are connected between emitter bonding sites 66 and the legs 38, 40 of the strip of copper 34. In addition, a wire bond 68 is connected between a gate bonding site 70 and a resistor 72 which is disposed atop and connected to the strip of copper 50. In this fashion, collector, emitter and gate electrodes of the IGBT 20 are electrically connected to the base plate 24, the connection tab 44 and the connection tab 56, respectively.

The components of each subassembly shown in FIGS. 3–5 (including the IGBT 20) are mechanically secured to one another by soldering and/or brazing, as appropriate. After fabrication of the subassemblies, they are tested to determine whether such subassemblies will be operable when incorporated in the package. Subassemblies found to be operable are then soldered, brazed or otherwise electrically and mechanically connected to the package support member 12, preferably all subassemblies at the same time.

Referring again to FIGS. 1 and 2, the connection tabs 44, 56 extend radially inwardly toward the central electrode structure 16. As seen specifically in FIG. 2, the central electrode structure includes a central tapered post 74, a circular emitter bus 76 carried on a tapered portion 77 of the post 74 and a bolt 78 extending through apertures in a lead connector 79 and an electrically conductive spacer 80 into a threaded bore 81 in the post 74. The bolt 78 bears against the connector 79 and the spacer 80 so that an electrical connection is established between the lead connector 79 and the post 74 and so that a flange 82 of the spacer 80 bears against and locks the bus 76 on the tapered portion 78.

Referring to FIGS. 1, 2 and 2A, a circular gate bus 84 includes a plurality of apertures 85 therethrough. The gate bus 84 is carried atop the emitter bus 76 and is electrically isolated therefrom by an insulative shouldered washer 86 and an insulative flat washer 87. The apertures 85 are disposed in alignment with threaded apertures 88 in the emitter bus 76 and in alignment with the apertures 58, 60 in the connection tabs 44, 56 such that electrical contact is established between the connection tab 56 and the gate bus 84 and so that electrical contact is established between the connection tab 44 and the emitter bus 76. The flat washer 87 electrically isolates the gate bus 84 from the connection tab 44. A screw and bolt 89 extends through a beveled washer 90, a flat washer 91, the shouldered washer 86 and the flat washer 87 into engagement with the threaded bore 88 in the emitter bus 76. Identical fastening arrangements are used to secure the connection tabs 44 and 56 of the remaining IGBT's to the emitter bus 76 and the gate bus 84. Electrical contact is thus established between the connection tabs 56 of the subassemblies 18 and the gate bus 84 so that the gate electrodes of the IGBT's 20 are connected in parallel. Also, electrical contact is established between the connection tabs 44 of the subassemblies 18 and the emitter bus 76 so that the emitter electrodes of the IGBT's 20 are connected in parallel.

The package support member 12 is supported by and brazed, soldered or otherwise secured to shouldered portions 94a, 95a of outer and inner rings 94, 95, respectively. A hollow cover 96 is secured to the outer ring 94 by bolts 97 to define an enclosure 98 which, as noted in greater detail hereinafter, provides for the passage of coolant therein. The cover 96 is further restrained by a conductive ring 99 secured to a face 93b of the inner ring 95 by bolts 101. The ring 99 overlaps the cover 96 and prevents movement away from the member 12.

A top cover 100 is cold welded or otherwise joined to a flange 102 of the outer ring 94 and hermetically seals the package 10. Kelvin and gate conductive leads or terminals 104, 106, respectively, are electrically connected to the emitter bus 76 and the gate bus 84 by crimping to the lead connector 79 and a lead connector 84a, respectively. The terminals 104, 106 extend through ceramic insulators 108, 110 in the cover 100.

Referring now to FIG. 6, there is illustrated in greater detail a bottom surface 112 of the package support member 12. A plurality of wedge-shaped sections of corrugated heat exchanger fin stock 114a–114f are brazed, soldered or otherwise secured to the bottom surface 112. The sections of fin stock are oriented such that the openings therein are directed approximately tangentially. Locator pins 116a–116f serve to locate the sections 114a–114f during assembly. As seen in FIG. 1, the locator pins also locate the device support structure 22 over the sections 114a–114f. Pins permit machining of the upper surface of the member 12 so that the device support structures 22 can be properly oriented and soldered thereto.

Figure 7:
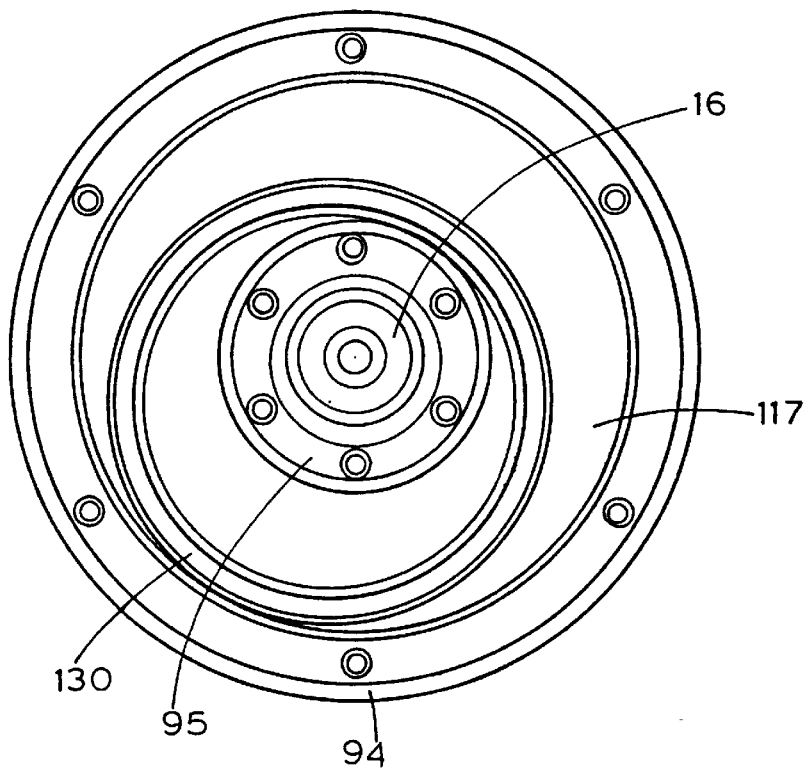
FIG. 7 comprises an elevational view of the bottom of the package support member.

As seen in FIGS. 2 and 7, a plate 117 is brazed, soldered or otherwise secured to the fin stock sections 114a–114c.

Figure 8:
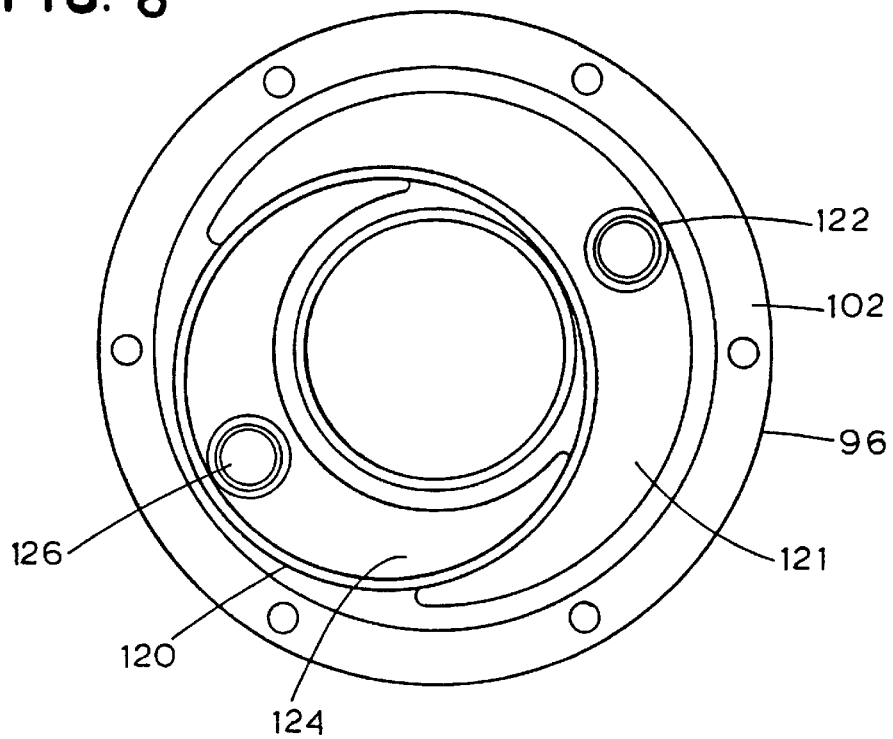
FIG. 8 comprises a plan view of the inside surface of the cover.

Referring now to FIG. 8, the cover 96 includes a circular wall 120 which is offset with respect to the center of the cover 96. The circular wall 120 thus defines a crescent-shaped portion 121 of the enclosure 98 which is in fluid communication with an inlet port 122. A further crescent-shaped portion 124 of the enclosure 98 is in fluid communication with an outlet port 126. The circular wall 120 fits within a mating circular channel 130 brazed, soldered or otherwise joined to the plate 117 and a sealant, such as RTV, is applied to prevent fluid leakage past the mating circular wall 120 and the circular slot 130.

During operation, fluid coolant, such as cooling oil, is admitted through the inlet port 122 under pressure. The pressurized fluid flows into the crescent-shaped portion 121 through the wedge-shaped sections 114a–114f and into the crescent-shaped portion 124 and out the outlet port 126. The orientations of the wedge-shaped sections 114a–114f result in flow direction approximately 90° with respect to the open flow direction (i.e., the flow direction of least resistance through each section). This flow direction results in a highly turbulent and efficient removal of heat from the IGBT's 20 through the package support member 12.

As seen in FIG. 2, collector currents flow between the ring 99 and the IGBT's 20 through the inner ring 95 and the package support member 12. Emitter currents flow coaxially within the collector currents from the IGBT's 20 to a terminal formed by a tapered portion 132 of the post 74. This arrangement minimizes the inductance from the terminals to the IGBT's so that turn on and turn off switching stresses are reduced.

FIG. 9 illustrates a modification of the present invention, it being understood that elements common to FIGS. 2 and 9 are assigned like reference numerals. As seen in FIG. 9, the package 10 may be modified by the addition of an electrically insulative member 150 fabricated of aluminum oxide or aluminum nitride and an electrically conductive inner collar 151 and the substitution of a modified package support member 152 for the package support member 12 and the inner ring 95 shown in FIG. 2. As should be evident by an inspection of FIG. 9, the package support member 152, and hence the collectors of the IGBT's, are electrically isolated from the external surface of the semiconductor package 10 and the coolant. Thus, handling restrictions during use of the package are reduced. In this embodiment, the ring 99 does not overlap the cover 96. Also, it may prove necessary to plate upper and lower faces 160, 162 only of the member 150 and solder the faces 160, 162 to the collar 151 and the member 152 to achieve a proper hermetic seal.

It should be noted that, in each of the foregoing embodiments, the various electrically conductive components may be fabricated of any suitable material such as aluminum, metal matrix or the like.

The switch package of the present invention permits separate testing of subassemblies prior to incorporation therein so that waste is reduced. Further, a compact package is provided that can withstand high voltages and currents, such as one thousand volts and one thousand amps, and includes integral cooling.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. A semiconductor package, comprising:
   an electrically conductive package support member having a central aperture therethrough:

a central electrode structure extending through the central aperture of the package support member and electrically isolated therefrom;

a plurality of semiconductor devices disposed on the package support member in an array surrounding the central electrode structure, each semiconductor device including first and second electrodes wherein the first electrodes of the semiconductor devices are electrically interconnected by their support member;

a first terminal electrically connected to the package support member;

wherein the central electrode structure includes a bus for electrically interconnecting the second electrodes of the semiconductor devices and a second terminal is coupled to the bus, each semiconductor device is disposed on an associated device support structure having a base plate electrically interconnecting the first electrode of the semiconductor device to the package support member and means for electrically coupling the second electrode of the semiconductor device to the bus of the central electrode structure; and wherein the coupling means comprises a strip of conductive material disposed on corrugated fin stock.

2. A semiconductor package, comprising:

an electrically conductive package support member having a central aperture therethrough:

a central electrode structure extending through the central aperture of the package support member and electrically isolated therefrom;

a plurality of semiconductor devices disposed on the package support member in an array surrounding the central electrode structure, each semiconductor device including first and second electrodes wherein the first electrodes of the semiconductor devices are electrically interconnected by their support member;

a first terminal electrically connected to the package support member;

wherein the central electrode structure includes a bus for electrically interconnecting the second electrodes of the semiconductor devices and a second terminal is coupled to the bus, each semiconductor device is disposed on an associated device support structure having a base plate electrically interconnecting the first electrode of the semiconductor device to the package support member and means for electrically coupling the second electrode of the semiconductor device to the bus of the central electrode structure; and further including a cover disposed over the semiconductor devices wherein the cover is in electrical contact with the first electrode of the semiconductor devices.

3. A semiconductor package, comprising:

an electrically conductive package support member having a central aperture therethrough:

a central electrode structure extending through the central aperture of the package support member and electrically isolated therefrom;

a plurality of semiconductor devices disposed on the package support member in an array surrounding the central electrode structure, each semiconductor device including first and second electrodes wherein the first electrodes of the semiconductor devices are electrically interconnected by their support member;

a first terminal electrically connected to the package support member;

wherein the central electrode structure includes a bus for electrically interconnecting the second electrodes of the semiconductor devices and a second terminal is coupled to the bus, each semiconductor device is disposed on an associated device support structure having a base plate electrically interconnecting the first electrode of the semiconductor device to the package support member and means for electrically coupling the second electrode of the semiconductor device to the bus of the central electrode structure; and further including a cover disposed over the semiconductor devices and means for electrically isolating the cover from the first electrodes of the semiconductor devices.

* * * * *